United States Patent
Buchholz et al.

(10) Patent No.: US 9,409,779 B2
(45) Date of Patent: *Aug. 9, 2016

(54) CATALYST FOR PRODUCING CARBON NANOTUBES BY MEANS OF THE DECOMPOSITION OF GASEOUS CARBON COMPOUNDS ON A HETEROGENEOUS CATALYST

(75) Inventors: Sigurd Buchholz, Köln (DE); Daniel Gordon Duff, Leverkusen (DE); Volker Michele, Köln (DE); Leslaw Mleczko, Dormagen (DE); Christian Münnich, Leverkusen (DE); Reiner Rudolf, Leverkusen (DE); Aurel Wolf, Wülfrath (DE)

(73) Assignee: Covestro Deutschland AG (DE)

( * ) Notice: Subject to any disclaimer, the term of this patent is extended or adjusted under 35 U.S.C. 154(b) by 1313 days.

This patent is subject to a terminal disclaimer.

(21) Appl. No.: 11/719,152
(22) PCT Filed: Nov. 8, 2005
(86) PCT No.: PCT/EP2005/011925
§ 371 (c)(1), (2), (4) Date: Feb. 27, 2008
(87) PCT Pub. No.: WO2006/050903
PCT Pub. Date: May 18, 2006

(65) Prior Publication Data
US 2009/0140215 A1    Jun. 4, 2009

(30) Foreign Application Priority Data
Nov. 13, 2004 (DE) .......... 10 2004 054 959

(51) Int. Cl.
B01J 21/10    (2006.01)
B01J 23/889   (2006.01)
(Continued)

(52) U.S. Cl.
CPC ........... *C01B 31/0233* (2013.01); *B01J 21/10* (2013.01); *B01J 23/8892* (2013.01);
(Continued)

(58) Field of Classification Search
CPC ............. H01B 1/24; H01B 1/22; C08K 3/04; H01C 7/027; B82Y 30/00; B01J 23/34; B01J 23/8892; B01J 23/6562; B01D 53/8675; B01D 53/945
USPC ......... 502/301, 305, 308, 310, 311, 312, 313, 502/317, 318, 321, 325, 324; 423/447.1, 423/447.2, 447.3; 977/742, 842, 843, 904, 977/932, 936, 938, 948
See application file for complete search history.

(56) References Cited

U.S. PATENT DOCUMENTS 3,701,822 A    10/1972  Negra et al.
4,058,571 A *  11/1977  Biedermann ........ B01J 23/8892
                                                     502/324
(Continued)

FOREIGN PATENT DOCUMENTS

EP    1391425 A1 *  2/2004
JP    59-46133 A    3/1984
(Continued)

OTHER PUBLICATIONS

Tan et al., "XPS Studies of Solvated Metal Atom Dispersed Catalysts. Evidence for Layered Cobalt—Manganese Particles on Alumina and Silica," 1991, J. Am. Chem. Soc., 113, pp. 855-861.*
(Continued)

*Primary Examiner* — Guinever S Gregorio
(74) *Attorney, Agent, or Firm* — Drinker Biddle & Reath LLP

(57) ABSTRACT

The present invention relates to a process for the production of carbon nanotubes, in particular those having a diameter of 3-150 nm and an aspect ratio of length:diameter (L:D)>100, by decomposition of hydrocarbons on a heterogeneous catalyst which comprises Mn, Co, preferably also molybdenum, and an inert support material, and the catalyst and the carbon nanotubes themselves and the use thereof.

13 Claims, 2 Drawing Sheets

Figure 1:
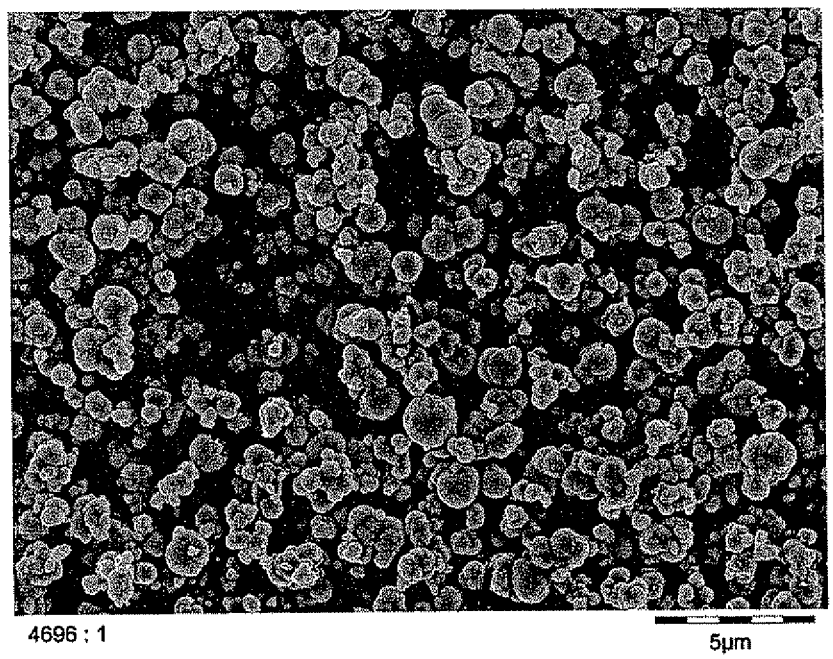

(51) Int. Cl.
*B82Y 10/00* (2011.01)
*B82Y 30/00* (2011.01)
*B82Y 40/00* (2011.01)
*C01B 31/02* (2006.01)
*D01F 9/10* (2006.01)
*D01F 9/127* (2006.01)
*H01L 51/00* (2006.01)

(52) U.S. Cl.
CPC ............ *B01J 23/8898* (2013.01); *B82Y 10/00* (2013.01); *B82Y 30/00* (2013.01); *B82Y 40/00* (2013.01); *D01F 9/127* (2013.01); *C01B 2202/34* (2013.01); *C01B 2202/36* (2013.01); *H01L 51/0048* (2013.01); *H01L 51/0052* (2013.01)

(56) References Cited

U.S. PATENT DOCUMENTS

| | | | |
|---|---|---|---|
| 6,761,870 B1* | 7/2004 | Smalley | B01J 3/04 423/445 R |
| 7,304,012 B2* | 12/2007 | Green et al. | 502/180 |
| 2003/0091496 A1* | 5/2003 | Resasco et al. | 423/447.3 |
| 2003/0147801 A1* | 8/2003 | Someya et al. | 423/447.3 |
| 2003/0148097 A1* | 8/2003 | Takikawa et al. | 428/364 |
| 2004/0151654 A1* | 8/2004 | Wei et al. | 423/447.3 |
| 2005/0112052 A1* | 5/2005 | Gu et al. | 423/447.1 |
| 2006/0057055 A1* | 3/2006 | Resasco et al. | 423/447.3 |
| 2006/0078489 A1* | 4/2006 | Harutyunyan et al. | 423/447.3 |
| 2006/0240974 A1 | 10/2006 | Hongo | |
| 2008/0153693 A1* | 6/2008 | Li et al. | 502/332 |
| 2009/0010822 A1 | 1/2009 | Dai et al. | |
| 2009/0270518 A1* | 10/2009 | Bezemer | B01J 8/06 518/714 |

FOREIGN PATENT DOCUMENTS

| | | | |
|---|---|---|---|
| JP | 11-507866 | | 7/1999 |
| JP | 2004-67413 A | | 3/2004 |
| JP | 2004-131360 A | | 4/2004 |
| JP | 2004-523460 A | | 8/2004 |
| WO | WO 97/00231 A1 | | 1/1997 |
| WO | WO 04/000456 | * | 12/2003 |
| WO | WO-2004/011178 A1 | | 2/2004 |
| WO | WO 2004/035883 A2 | * | 4/2004 |

OTHER PUBLICATIONS

Tan et al, "XPS Studies of Solvated Metal Atom Dispersed Catalysts. Evidence for Layered Cobalt—Manganese Particles on Alumina and Silica", J. Am. Chem. Soc. 1991, 113, 855-861.*

* cited by examiner

CATALYST FOR PRODUCING CARBON NANOTUBES BY MEANS OF THE DECOMPOSITION OF GASEOUS CARBON COMPOUNDS ON A HETEROGENEOUS CATALYST

RELATED APPLICATIONS

This application is a national stage application (under 35 U.S.C. 371) of PCT/EP2005/011925 filed Nov. 8, 2005, which claims the benefit of German application 10 2001 054 959.1 filed Nov. 13, 2004.

The present invention relates to a process for the production of carbon nanotubes, in particular those having a diameter of 3-150 nm and an aspect ratio of length: diameter (L:D)>100, by decomposition of hydrocarbons on a heterogeneous catalyst which comprises Mn, Co, preferably also molybdenum, and an inert support material, and the catalyst and the carbon nanotubes themselves and the use thereof.

Carbon nanotubes are chiefly understood as meaning cylindrical carbon tubes having a diameter of between 3 and 80 nm, the length being several times, at least 100 times, the diameter. These tubes are made up of layers of ordered carbon atoms and have a core of different morphology. These carbon nanotubes are also called, for example, carbon fibrils or hollow carbon fibres. Because of their dimensions and their particular properties, the carbon nanotubes described are of industrial importance for the production of composite materials. Essential further possibilities lie in electronic uses, energy uses and further uses.

Carbon nanotubes are a material which has been known for a relatively long time. Although Iijima in 1991 (S. Iijima, Nature 354, 56-58, 1991) is generally named as the discoverer of nanotubes, these materials, in particular fibrous graphite materials with several graphite layers, were already known for a relatively long time. Thus e.g. the deposition of very fine fibrous carbon from the catalytic decomposition of hydrocarbons was already described in the 70s and early 80s (GB 1469930A1, 1977 and EP 56004 A, 1982, Tates and Baker). Nevertheless, the carbon filaments produced on the basis of short-chain hydrocarbons are not characterized in more detail in respect of their diameter. The production of carbon nanotubes having diameters of less than 100 nm is also described, inter alia, in EP 205 556 B1 and WO A 86/03455. Light (i.e. short- and medium-chain aliphatic or mono- or dinuclear aromatic) hydrocarbons and a catalyst based on iron, on which carbon supports are decomposed at temperatures above 800-900° C., are described here for the production. The known methods include, for example, arc, laser ablation and catalytic processes. In many of these processes, carbon black, amorphous carbon and fibres having large diameters are formed as by-products. In the catalytic processes, a distinction may be made between deposition on supported catalyst particles and deposition on metal centres formed in situ and having diameters in the nanometre range (so-called flow process). In the case of production via catalytic deposition of carbon from hydrocarbons which are gaseous under the reaction conditions (in the following CCVD; catalytic carbon vapour deposition), acetylene, methane, ethane, ethylene, butane, butene, butadiene, benzene and further carbon-containing educts are mentioned as possible carbon donors. The catalysts as a rule comprise metals, metal oxides or decomposable or reducible metal components. For example, Fe, Mo, Ni, V, Mn, Sn, Co, Cu and others are mentioned as metals in the prior art. The individual metals usually indeed have a tendency to form nanotubes, but according to the prior art high yields and low contents of amorphous carbons are advantageously achieved with metal catalysts which comprise a combination of the abovementioned metals. According to the prior art, particularly advantageous systems are based on combinations which comprise Fe or Ni. The formation of carbon nanotubes and the properties of the tubes formed depend in a complex manner on the metal component used as the catalyst or a combination of several metal components, the support material used and the interaction between the catalyst and support, the educt gas and its partial pressure, admixing of hydrogen or further gases, the reaction temperature and the dwell time and the reactor used. Optimization of the production process is a particular challenge for an industrial process.

It is to be noted that the metal component used in CCVD and called a catalyst is consumed in the course of the synthesis process. This consumption is to be attributed to a deactivation of the metal component, e.g. due to deposition of carbon on the entire particle, which leads to complete covering of the particle (this is known to the person skilled in the art as encapping). Reactivation as a rule is not possible or does not make economic sense. Often only at most a few grams of carbon nanotubes are obtained per gram of catalyst, the catalyst here including the entirety of support and catalyst used. Because of the consumption of catalyst described, a high yield of carbon nanotubes based on the catalyst employed is a substantial requirement of the catalyst and process.

For an industrial production of carbon nanotubes, e.g. as a constituent for improving the mechanical properties or conductivity of composite materials, as with all industrial processes a high space/time yield is to be aimed for, while retaining the particular properties of the nanotubes and minimizing the energy and operating materials to be used. Uses based on laser ablation of carbon often deliver only low production rates and high contents of amorphous carbon or carbon black. The conversion of these structures on the laboratory scale with production rates of a few grams per day into an industrial scale is usually possible only with difficulty. Thus, laser ablation is also expensive and a scale-up difficult. Various processes described in the literature for the production of carbon nanotubes by CCVD indeed show the suitability in principle of various catalysts, but often have only a low productivity. Catalysts and particular reaction steps which, in addition to the reaction step of deposition, also describe the targeted pretreatment in particular reaction atmospheres, such as, in particular, reducing hydrogen atmospheres, are also described for the production of carbon nanotubes.

The following examples from the literature and, in particular, patent literature and the references contained therein are intended to illustrate the prior art.

Various processes and catalysts are known for the production of carbon nanotubes. Such carbon nanotubes are already described in EP 0205 556 A1 (Hyperion Catalysis International). The cited application for a protective right describes an iron-containing catalyst and the reaction of the most diverse hydrocarbons at high temperatures above 800-1,000° C. The use of Ni as a catalyst is likewise described e.g. in the dissertation of M. G. Nijkamp, University of Utrecht, NL, 2002 "Hydrogen Storage using Physisorption Modified Carbon Nanofibers and Related Materials". Ni-based systems are likewise described by Shaikhutdinov et al. (Shamil K. Shaikhutdinov, L. B. Avdeeva, O. V. Goncharova, D. I. Kochubey, B. N. Novgorodov, L. M. Plyasova, "Coprecipitated Ni—Al and Ni—Cu—Al catalysts for methane decomposition and carbon deposition I.", Applied Catalysis A: General, 126, 1995, pages 125-139) as active in the decomposition of methane to give carbon nano-materials. A further overview of production methods is given, for example, by Geus and De Jong in a review article (K. P. De Jong and J. W. Geus in Catal. Rev.-Sci, Eng. 42(4), 2000, pages 481-510). Both pure metals and combinations of various metals can be employed, as e.g. the Applications WO 03/004410 (Nanocyl), U.S. Pat. No. 6,358,878 B1 (Hyperion Catalysis International), U.S. Pat. No. 6,518,218 B1 (General Electric), CN 1443708 (University of Zhejiang) disclose. However, the optimum yield of carbon tubes is usually still unsatisfactory, or there must be an increased industrial outlay in order to obtain materials having the desired properties, as is explained below. The industrial production of carbon nanotubes is the subject of numerous studies. On the basis of the importance of the catalysts for the production of carbon nanotubes which is described in these sections, the reaction apparatuses used are closely linked with the catalyst used and the resulting properties of the nano-material produced. Comparable catalytically active elements or combinations thereof can indeed be employed, but the optimum conditions of the industrial reaction procedures only emerge from the complicated interplay of educt gas and concentration, catalyst properties, hydrodynamics in the reactor and product properties.

EP 1 375 424 A1 describes an industrial device for the production of carbon nano-materials and also mentions a very general catalyst composition. The catalyst composition is stated with the presence of the elements Fe, Ni or Co. However, no precise, particularly suitable composition is mentioned. In a work by Cassell et al., various catalysts for the production of single wall carbon nanotubes which are based on iron/molybdenum are described. If 5 g of catalyst are employed, just 1.5 g of carbon nanotubes are produced (Cassell et al. "Large Scale Synthesis of Single-Walled Carbon Nanotubes", Journal of Physical Chemistry, 1999, 103 (31), pages 6484-6492). Wang et al. (Y. Wang, F. Wie, G. Gu and H. Yu, "Agglomerated carbon nanotubes and its mass production in a fluidized bed reactor", Physica B, 2002, 323, pages 327-329) describe the use of a pure Fe catalyst for the production of agglomerates smaller than 100 µm. The use of porous materials (e.g. silica, alumina or zeolites) leads to the disadvantages that an increased formation of carbon black and/or amorphous carbon is observed and these support materials, because of their chemical resistance, can be separated from the carbon materials only with difficulty without these being attacked by the purification (Hiura et al., NEC Corporation, U.S. Pat. No. 5,698,175).

For the purification of the carbon nanotubes from catalyst constituents e.g. purification steps with dilute or highly oxidizing mineral acids, dilute on concentrated bases or combinations thereof are possible (K. Hernadi et al., Solid State Ionincs, 141-142, 2001, 203-209, M. Toebes et al., Catalysis, 42, 2004, 307-315).

EP 1 318 102 A1 and WO 03/004410 A1 Nanocyl S.A.) mention catalysts based on the elements Fe, Co, Ni, V, Mo, Cu on particularly selected supports. The maximum yields are still at values of $m_{nanotubes}/m_{catalyst} \leq 5\text{-}6$. The supports selected are said to lead to easy purification with advantageous properties of the nanotubes produced. Hydroxides and carbonates are mentioned as particular supports, but, as is known to the person skilled in the art, these are converted into the corresponding oxides at the temperatures necessary for synthesis of carbon nano-materials. These supports must moreover be prepared separately and the active component comprising one or more metal oxides or reducible metal compounds must be applied to these supports. In this context, the amount of active components which can be applied is limited, since only low loadings with an active component lead to a high dispersion and small primary particle diameters, and therefore render possible the formation of carbon nanotubes (G. Ertl, H. Knözinger, J. Weitkamp, Handbook of Heterogeneous Catalysis, VCH, Weinheim, Germany, 1997, vol. 1, p. 191 et seq., K. P. De Jong, J. W. Geus, Catal. Rev. Sci. Eng., 2000, 42, 4, 481-510, dissertation by M. S. Hoogenraad, University of Utrecht, NL, 1995).

EP 1368505 A1 (Electrovac) describes coating of a substrate with an Ni- or Co-based catalyst. In this context, there is a high industrial outlay in the preparation of the substrate with a particular layer of Ni- or Co-based catalyst deposited without a current. Furthermore, in the process, which is to be operated only batchwise, the catalyst is subjected to a thermal activation phase in a reducing atmosphere, which means an additional outlay.

WO 200006311 A1 describes a process for the production of nanotube films, in which the catalyst can comprise Fe, Co, Al, Ni, Mn, Pd, Cr and mixtures thereof. However, the catalysts are not described further, and no reference is made to particularly suitable combinations of these elements.

US 2003/0148097 A1 describes a method for the production of spiral or twisted nanotubes, wherein the catalyst influences the form of the product. The catalyst comprises one or more elements from the group consisting of Fe, Co, Al, Ni, Mn, Pd and Cr, or these elements or mixtures thereof combined with further elements or oxides. No reference is made to particular combinations of elements from this group for improving the yield.

Optimum structures which allow good incorporation properties, in particular dispersibility, are said to be obtained by particular support/particle configurations. The structure of the carbon nano-materials has been optimized in particular by this means. For the production of a particular modification of the carbon nanotubes specifically for use in polymers, the use of supports having a well-defined structure is also reported e.g. in U.S. Pat. No. 6,358,878 B1 (Hyperion Catalysis International Inc.). Partial parallel alignment of the long nanotubes and fibres into bundles is achieved by the use of support materials which have a structure of cleavable planar surfaces or are made of crystallites having just such cleavable surfaces. These materials indeed deliver a material which is particularly suitable for polymer use, but the active components are preferably applied by soaking and impregnation processes. As is generally known in the literature for the preparation of heterogeneous catalysts, however, the amount of catalyst loading with simultaneously high dispersing is limited. Needless to say, very high dispersings or low diameters of the active catalyst components are advantageous for the growth of carbon nanotubes. Small active component diameters are achieved during impregnations or precipitations on the catalyst support only at low loadings and a high dispersion. As a result, the performance of the catalysts used is severely limited. U.S. Pat. No. 6,358,878 B1 mentions typical yields of the order of 20-25 times the catalyst weight employed. Higher yields are not disclosed. With the catalysts described, the content of residues of catalyst and support is so high that these residues must be removed for the farther use. This results in an increased industrial outlay, which involves several further process steps. Furthermore, under certain circumstances the morphology and properties of the carbon nanotubes are influenced by the working up and purification, depending on the procedure chosen.

Easy removal of the catalyst is also the aim, for example, in the above-mentioned Application WO 03/004410 A1. The use of hydroxides and/or carbonates of Ca, Mg, Al, Ce, Ti and La as a support is mentioned as a solution to this problem.

In principle, the processes and catalysts known as prior art have the problem that the ratio of amount of catalyst/amount of CNTs produced is not satisfactory.

The object of the present invention was now to develop, on the basis of the prior art, a catalyst and a process for the production of the carbon nanotubes described above which render possible the production of multilayered carbon nanotubes having diameters of from 3 to 200 nm, preferably 3-150 nm, particularly preferably 3-60 nm, and an aspect ratio of L:D>100, preferably >500, particularly preferably >3,000, in an industrially efficient manner, i.e. in particular the highest possible educt conversions and a low addition of catalyst.

The invention therefore provides a catalyst and a process for the deposition of carbon nanotubes using such a catalyst from the gas phase on heterogeneous catalysts with the base components Mn and Co, preferably Mn and Co in similar ratios, preferably in the additional presence of Mo and optionally further transition metals, hydrocarbons which are gaseous under the reaction conditions being employed as the educt.

Surprisingly, in the experiments on heterogeneously catalyzed deposition of carbon nanotubes, it was found that a catalyst based on the elements Mn—Co not only produced carbon nanotubes in a very good quality and with a high graphitic content, but the yield of carbon nanotubes, based on the weight of catalyst employed, is also particularly high under suitable reaction conditions. Surprisingly, higher yields are obtained than with Fe and Fe/Mo catalysts prepared in a comparable manner.

In this context, the carbon nanotubes surprisingly grow in the form of an "expanding universe", the catalyst primary particles contained in the catalyst agglomerates being driven apart by the nanotubes growing statistically in all directions and a looser material having a bulk density of <500 kg·m$^{-3}$ being formed.

The catalyst according to the invention is based on the components manganese and cobalt. An addition of molybdenum is advantageous. In addition to the base components, one or more metal components can be added. Examples of the latter are all transition metals, preferably metal components based on the elements Fe, Ni, Cu, W, V, Cr and Sn. The catalyst according to the invention preferably comprises 2-98 mol % Mn and 2-98 mol % Co, based on the content of active components in metallic form. A content of 10-90 mol % Mn and 10-90 mol % Co is particularly preferred, and a content of 25-75 mol % Mn and 25-75 mol % Co is particularly preferred. The sum of the contents of Mn and Co, or Mn, Co and Mo here is not necessarily 100% if further elements, as mentioned above, are added. An addition of 0.2-50% of one or more further metal components is preferred. A content of 10-90 mol % Mn, 10-90 mol % Co and 0-10 mol % molybdenum is particularly preferred. A content of 25-75 mol % Mn, 25-75 mol % Co and 0-25 mol % molybdenum is very particularly preferred.

Catalysts which have similar weight contents of Mn and Co are preferred in particular. A ratio of Mn/Co of from 2:1 to 1:2 is preferred, particularly preferably 1.5:1 to 1:1.5.

The catalyst according to the invention can be prepared in various ways. Precipitation on to support materials, impregnation of support materials, coprecipitation of the catalytically active substances in the presence of a support, coprecipitation of the catalytically active metal compounds together with the support material or coprecipitation of the catalytically active metal compounds together with an inert component, which forms a support material in further steps of the catalyst treatment, are conceivable.

Various starting compounds can be employed, as long as these are soluble in the solvent used, or in the case of precipitation or coprecipitation, can also be precipitated together. Examples of these starting compounds are acetates, nitrates, chlorides and further soluble compounds. The precipitation can be brought about e.g. by a change in the temperature, the concentration (also by evaporation of the solvent), by a change in the pH and/or by the addition of a precipitating agent or combinations thereof. Light alcohols and/or water are preferred as the solvent. Aqueous synthesis routes are particularly preferred.

Coprecipitation of the components, in particular from aqueous solution, e.g. with the addition of ammonium carbonate, ammonium hydroxide, urea and alkali metal carbonates and hydroxides, is advantageous and therefore preferred.

The precipitation can be carried out either batchwise or continuously. To improve the precipitation properties and for surface modification of the solids prepared, surface-active substances (e.g. ionic or nonionic surfactants or carboxylic acids) can be added. The catalyst, which is obtained in the form of a solid, can be separated from the educt solutions by methods known to the person skilled in the art, such as e.g. filtration, centrifugation, evaporation and concentration. Centrifugation and filtration are preferred. The solid obtained can be washed further or employed further directly, as obtained. For an improved ease of handling of the catalyst obtained, this can be dried. As is known for heterogeneous catalysts, further conditioning of the catalysts may be of advantage. This conditioning can be calcining and thermal treatment as well as treatment with reactive atmospheres or e.g. water vapour with the aim of improving the catalytic properties. A thermal pretreatment in an oxidizing atmosphere at temperatures of between 300° C. and 900° C. is preferred. The conditioning can be preceded or followed by a shaping and/or grading. In certain cases it may be advantageous for the catalyst which is to be employed industrially to be pretreated with a reactive gas, such as e.g. $H_2$, hydrocarbons, CO or with mixtures of the gases mentioned. Via such a pretreatment, the metal compounds present can be modified in their oxidation state, or the morphology of the catalyst structure can be influenced.

The direct use of the catalyst, a reductive pretreatment or entire or partial conversion of the catalytically active substances into the corresponding carbides are preferred.

The process according to the invention can be carried out in various types of reactor Examples which may be mentioned here are fixed bed reactors, tube reactors, rotary tube reactors, migrating bed reactors, reactors with a bubble-forming, turbulent or jet-type fluidized bed, called internally or externally circulating fluidized beds. It is also possible to introduce the catalyst into a reactor which, for example, falls under the abovementioned classes and is filled with particles. These particles can be inert particles and/or can entirely or partly comprise a further catalytically active material. These particles can also be agglomerates of carbon nanotubes. The process can be carried out, for example, continuously or discontinuously, continuously or discontinuously relating both to the catalyst feed and to the removal of the carbon nanotubes formed together with the spent catalyst.

Possible educt gases are light hydrocarbons, such as aliphatics and olefins. However, alcohols, carbon oxides, in particular CO, aromatic compounds with and without hetero atoms and functionalized hydrocarbons, such as e.g. aldehydes or ketones, can also be employed as long as these are decomposed on the catalyst. It is also possible to employ mixtures of the abovementioned hydrocarbons. Suitable compounds are, in particular, e.g. methane, ethane, propane, butane or higher aliphatics, ethylene, propylene, butene, butadiene or higher olefins or aromatic hydrocarbons or carbon oxides or alcohols or hydrocarbons with hetero atoms. Short- and medium-chain, that is to say having a C number of from 1 or, respectively, 2 to 10, aliphatic or olefinic hydrocarbons or mono- or dinuclear aromatic hydrocarbons are preferably employed. Aliphatics ($C_xH_{2x+2}$) and olefins ($C_xH_y$) having a C number x of x=1-4 or, respectively, 2-4 are particularly preferably employed.

The carbon-releasing educt can be fed in gaseous form, or vaporized in the reaction chamber or a suitable preceding apparatus. Hydrogen or an inert gas, for example noble gases or nitrogen, can be added to the educt gas. It is possible to carry out the process according to the invention for the production of carbon nanotubes with the addition of an inert gas or a mixture of several inert gases with and without hydrogen in any desired combination. The reaction gas preferably comprises carbon carrier, hydrogen and optionally an inert component to establish advantageous reactant partial pressures. The addition of a component which is inert in the reaction as an internal standard for analysis of the educt gas or product gas or as a detection aid in process monitoring is also conceivable.

The production can be carried out under pressures above and below atmospheric pressure. The process can be carried out under pressure of from 0.05 bar to 200 bar, pressures of from 0.1 to 100 bar are preferred, and pressures of from 0.2 to 10 bar are particularly preferred. The temperature can be varied in the temperature range of from 300° C. to 1,600° C. However, it must be high enough for the deposition of carbon by decomposition to take place with a sufficient speed and should not lead to a significant autopyrolysis of the hydrocarbon in the gas phase. This would lead to a high content of amorphous carbon, which is not preferred, in the resulting material. The advantageous temperature range is between 500° C. and 800° C. A decomposition temperature of from 550° C. to 750° C. is preferred.

The catalyst can be brought into the reaction chamber batchwise or continuously. The catalyst can be reduced, as described, before introduction into the actual reaction chamber, or added in an oxidic form of the chiefly catalytically active metals or even in the form of the precipitated hydroxides or carbonates.

The carbon nanotubes produced in this way can usually, if the application allows, be employed without prior working up because of the low catalyst content in the end product. The materials can optionally be purified, e.g. by chemical dissolving of the residues of catalyst and support, by oxidation of the contents of amorphous carbon which are formed in very small amounts or by a thermal after-treatment in an inert or reactive gas. It is possible for the carbon nanotubes produced to be functionalized chemically, in order e.g. to obtain improved bonding into a matrix or to adapt the surface properties to the desired use in a targeted manner.

The carbon nanotubes produced according to the invention are suitable for use as additives in polymers, in particular for mechanical reinforcing and to increase the electrical conductivity. The carbon nanotubes produced can furthermore be employed as a material for gas and energy storage, for dyeing and as flameproofing agents. Because of the good electrical conductivity, the carbon nanotubes produced according to the invention can be employed as electrode material or for the production of strip conductors and conductive structures. It is also possible to employ the carbon nanotubes produced according to the invention as emitters in displays. Preferably, the carbon nanotubes are employed in polymer composite materials, ceramic or metal composite materials for improving the electrical or thermal conductivity and mechanical properties, for the production of conductive coatings and composite materials, as a dyestuff, in batteries, capacitors, displays (e.g. flat screen displays) or lamps, as a field effect transistor, as a storage medium e.g. for hydrogen or lithium, in membranes e.g. for purification of gases, as a catalyst or as a support material e.g. for catalytically active components in chemical reactions, in fuel cells, in the medical sector e.g. as a matrix for controlling the growth of cell tissue, in the diagnostics sector e.g. as a marker, and in chemical and physical analysis (e.g. in scanning force microscopes).

The process according to the invention and the catalysts according to the invention are illustrated in the following with the aid of some examples, but the examples are not to be understood as a limitation of the inventive concept.

EXAMPLES ACCORDING TO THE INVENTION

Example 1

Preparation of the Catalysts with Different Stoichiometry, Solvent, Precipitating Agent, Temperature The catalysts were preferably prepared by a joint precipitation.

Catalyst 1 (MCN0062_23Mn_27Co_11Mo_39Al): Three solutions were prepared from 2.5 g $(NH_4)_6Mo_7O_{24}.4H_2O$ in 50 ml deionized water, 17.8 g $Co(NO_3)_2.6H_2O$ in 50 ml deionized water and 15.4 g $Mn(NO_3)_2.4H_2O$ in 50 ml deionized water. The solutions were combined at room temperature and stirred for 5 min. The non-cloudy mixture obtained was combined with a solution of 50.0 g $Al(NO_3)_3.9H_2O$ in 35 ml water and stirred. Clouding was dissolved by dropwise addition of dilute $HNO_3$. The solution obtained in this way is subsequently called solution A. A solution called solution B in the following was prepared by stirring 70.0 g $(NH_4)_2CO_3$ into 225 ml deionized water. The two solutions A and B were added dropwise at room temperature, with intensive stirring, into a multi-necked round-bottomed flask with a reservoir of 200 ml deionized water, the pH being kept at pH =7. After the metering (approx. 20 minutes), the mixture was subsequently stirred for a further 5 min and the solid obtained was filtered off. The solid was twice suspended in water and dispersed by stirring for 5 min and filtered off. The filter cake was dried over night at 180° C. in air and subsequently calcined at 400° C. in air for 4 h. After the calcining, 14.9 g of a black solid were obtained. The theoretical ratio of the active metals employed, based on the support material, is Mn:Co:Mo:$Al_2O_3$=23:7:11:39.

Catalyst 2 (MCN0071_20Mn_21CO_20Mo_39Al): Three solutions were prepared from 6.8 g $(NH_4)_6Mo_7O_{24}.4H_2O$ in 50 ml deionized water, 19.8 g $Co(NO_3)_2.6H_2O$ in 50 ml deionized water and 16.8 g $Mn(NO_3)_2.4H_2O$ in 50 ml deionized water. The solutions were combined at room temperature and stirred for 5 min. The non-cloudy mixture obtained was combined with a solution of 50.0 g $Al(NO_3)_3.9H_2O$ in 35 ml water and stirred. The solution obtained in this way is subsequently called solution A. A solution called solution B in the following was prepared by stirring 70.0 g $(NH_4)_2CO_3$ into 225 ml deionized water. The two solutions A and B were added dropwise at room temperature, with intensive stirring, into a multi-necked round-bottomed flask with a reservoir of 200 ml deionized water, the pH being kept at pH 7. After the metering (approx. 20 minutes), the mixture was subsequently stirred for a further 5 min and the solid obtained was filtered off. The solid was twice suspended in water and dispersed by stirring for 5 min and filtered off. The filter cake was dried over night at 180° C. in air and subsequently calcined at 400° C. in air for 4 h. After the calcining, 17.7 g of a black solid were obtained. The theoretical ratio of the active metals employed, based on the support material, is Mn:Co:Mo:$Al_2O_3$=23:7:11:39.

Catalyst 3 (MCN0068_5Mn_45CO_11Mo_39Al): Three solutions were prepared from 2.5 g $(NH_4)_6Mo_7O_{24}.4H_2O$ in 50 ml deionized water, 34.5 g $Co(NO_3)_2.6H_2O$ in 50 ml deionized water and 3.2 g $MnNO_3)_2.4H_2O$. The solutions were combined at room temperature and stirred for 5 min. The non-cloudy mixture obtained was combined with a solution of 50.0 g $Al(NO_3)_3.9H_2O$ in 35 ml water and stirred. The solution obtained in this way is subsequently called solution A. A solution called solution B in the following was prepared by stirring 70.0 g $(NH_4)_2CO_3$ into 225 ml deionized water.

The two solutions A and B were added dropwise at room temperature, with intensive stirring, into a three-necked flask with a reservoir of 200 ml deionized water, the pH being kept at pH=7. After the metering (approx. 20 minutes), the mixture was subsequently stirred for a further 5 min and the solid obtained was filtered off. The solid was twice suspended in water and dispersed by stirring for 5 min and filtered off. The filter cake was dried over night at 180° C. in air and subsequently calcined at 400° C. in air for 4 h. After the calcining, 16.8 g of a black solid were obtained. The theoretical ratio of the active metals employed, based on the support material, is Mn:Co:Mo:$Al_2O_3$=5:45:11:39.

Catalyst 4 (MCN0070_35Mn_15CO_11Mo_39Al): Three solutions were prepared from 2.5 g $(NH_4)_6Mo_7O_{24}.4H_2O$ in 50 ml deionized water, 11 g $Co(NO_3)_2.6H_2O$ in 100 ml deionized water and 24 g $Mn(NO_3)_2.4H_2O$ in 10 ml deionized water. The solutions were combined at room temperature and stirred for 5 min. The non-cloudy mixture obtained was combined with a solution of 50.0 g $Al(NO_3)_3.9H_2O$ in 35 ml water and stirred. The solution obtained in this way is subsequently called solution A. A solution called solution B in the following was prepared by stirring 70.0 g $(NH_4)_2CO_3$ into 225 ml deionized water. The two solutions A and B were added dropwise at room temperature, with intensive stirring, into a three-necked flask with a reservoir of 200 ml deionized water, the pH being kept at pH=7. After the metering (approx. 20 minutes), the mixture was subsequently stirred for a further 5 min and the solid obtained was filtered off. The solid was twice suspended in water and dispersed by stirring for 5 min and filtered off. The filter cake was dried over night at 180° C. in air and subsequently calcined at 400° C. in air for 4 h. After the calcining, 16.8 g of a black solid were obtained. The theoretical ratio of the active metals employed, based on the support material, is Mn:Co:Mo:$Al_2O_3$=35:15:11:39.

Catalyst 5 (MCN0074_29Mn_3Co-39Al): Two solutions were prepared from 29.5 g $Co(NO_3)_2.6H_2O$ in 50 ml deionized water and 25.1 g $Mn(NO_3)_2.4H_2O$ in 50 ml deionized water. The solutions were combined at room temperature and stirred for 5 min. The non-cloudy mixture obtained was combined with a solution of 50.0 g $Al(NO_3)_3.9H_2O$ in 35 ml water and stirred. The solution obtained in this way is subsequently called solution A. A solution called solution B in the following was prepared by stirring 70.0 g $(NH_4)_2CO_3$ into 225 ml deionized water. The two solutions A and B were added dropwise at room temperature, with intensive stirring, into a three-necked flask with a reservoir of 200 ml deionized water, the pH being kept at pH=7.5. After the metering (approx. 20 minutes), the mixture was subsequently stirred for a further 5 min and the solid obtained was filtered off. The solid was twice suspended in water and dispersed by stirring for 5 min and filtered off. The filter cake was dried over night at 180° C. in air and subsequently calcined at 400° C. in air for 4 h. After the calcining, 21.8 g of a black solid were obtained. The theoretical ratio of the active metals employed, based on the support material, is Mn:Co:$Al_2O_3$=29:32:39.

Catalyst 6 (MCN0072_23Mn_27CO_11Mo_39Mg): Three solutions were prepared from 2.5 g $(NH_4)_6Mo_7O_{24}.4H_2O$ in 50 ml deionized water, 17.8 g $Co(NO_3)_2.6H_2O$ in 100 ml deionized water and 15.4 g $Mn(NO_3)_2.4H_2O$ in 50 ml deionized water. The solutions were combined at room temperature and stirred for 5 min. The non-cloudy mixture obtained was combined with a solution of 41.0 g $Mg(NO_3)_2.6H_2O$ in 35 ml water and stirred. The solution obtained in this way is subsequently called solution A. A solution called solution B in the following was prepared by stirring 70.0 g $(NH_4)_2CO_3$ into 225 ml deionized water. The two solutions A and B were added dropwise at room temperature, with intensive stirring, into a three-necked flask with a reservoir of 200 ml deionized water, the pH being kept at pH=7. After the metering (approx. 20 minutes), the mixture was subsequently stirred for a further 5 min and the solid obtained was filtered off. The solid was twice suspended in water and dispersed by stirring for 5 min and filtered off. The filter cake was dried over night at 180° C. in air and subsequently calcined at 400° C. in air for 4 h. After the calcining, 7.9 g of a black solid were obtained. The theoretical ratio of the active metals employed, based on the support material, is Mn:Co:Mo:MgO=23:27:11:39.

Figure 2:
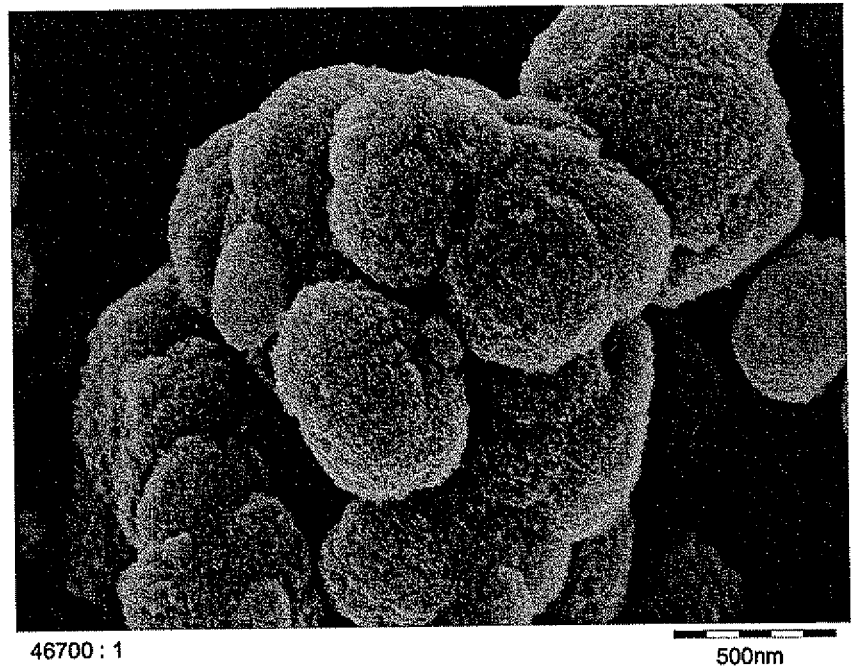

SEM (scanning electron microscope) photographs of the catalyst prepared were produced after drying and after calcining for 2 h at 650° C., i.e. at a temperature which corresponds to the reaction temperature. These show that the coprecipitated product is agglomerates of spherical crystals (FIGS. 1 and 2). After heat treatment (FIGS. 3 and 4), the size of the spherical primary crystallites has increased in the nanometre range, but the agglomerate structure remains comparable.

Catalyst 7 MCN0076_28Mn_33CO_39Mg): Two solutions were prepared from 21.8 g $Co(NO_3)_2.6H_2O$ in 50 ml deionized water and 18.4 g $Mn(NO_3)_2.4H_2O$ in 50 ml deionized water. The solutions were combined at room temperature and stirred for 5 min. The non-cloudy mixture obtained was combined with a solution of 41.0 g $Mg(N_3)_2.6H_2O$ in 35 ml water and stirred. The solution obtained in this way is subsequently called solution A. A solution called solution B in the following was prepared by stirring 70.0 g $(NH_4)_2CO_3$ into 225 ml deionized water. The two solutions A and B were added dropwise at room temperature, with intensive stirring, into a three-necked flask with a reservoir of 200 ml deionized water, the pH being kept at pH =7. After the metering (approx. 20 minutes), the mixture was subsequently stirred for a further 5 min and the solid obtained was filtered off. The solid was twice suspended in water and dispersed by stirring for 5 min and filtered off. The filter cake was dried over night at 180° C. in air and subsequently calcined at 400° C. in air for 4 h. After the calcining, 10.4 g of a black solid were obtained. The theoretical ratio of the active metals employed, based on the support material, is Mn:Co:MgO=28:33:39.

Catalyst 8 (MCN0079_28Mn_33Co_39Mg): Two solutions were prepared from 21.8 g $Co(NO_3)_2.6H_2O$ in 50 ml deionized water and 18.4 g $Mn(NO_3)_2.4H_2O$ in 50 ml deionized water. The solutions were combined at room temperature and stirred for 5 min. The non-cloudy mixture obtained was combined with a solution of 41.0 g $Mg(NO_3)_2.6H_2O$ in 35 ml water and stirred. The solution obtained in this way is subsequently called solution A. A solution called solution B in the following was prepared by stirring 20.0 g NaOH into 200 ml deionized water. The two solutions A and B were added dropwise at room temperature, with intensive stirring, into a three-necked flask with a reservoir of 200 ml deionized water, the pH being kept at pH =10. After the metering (approx. 20 minutes), the mixture was subsequently stirred for a further 5 min and the solid obtained was filtered off. The solid was twice suspended in water and dispersed by stirring for 5 min and filtered off. The filter cake was dried over night at 180° C. in air and subsequently calcined at 400° C. in air for 4 h. After the calcining, 16.8 g of a black solid were obtained. The theoretical ratio of the active metals employed, based on the support material, is Mn:Co:MgO=28:33:39.

Example 2

Growing of Carbon Nanotubes, Fixed Bed, Laboratory

The catalysts were tested in a fixed bed apparatus on the laboratory scale. For this, a defined amount of catalyst was initially introduced into a quartz tube having an internal diameter of 9 mm and heated externally by a heat transfer medium. The temperature of the heaps of solid was regulated via a PID regulation of the electrically heated heat transfer medium. The temperature of the catalyst heap or of the catalyst/nanotube mixture was determined by a thermocouple enclosed in an inert quartz capillary. Educt gases and inert dilution gases were passed into the reactor via electronically controlled mass flow regulators. The catalyst samples were first heated in a stream of hydrogen and inert gas. When the desired temperature was reached, the educt gas was switched on. The volume ratio of the educt gas mixture was ethene:$H_2$:Ar=45:60:5. The total volume flow was adjusted to 110 $ml_N \cdot min^{-1}$. Charging of the catalyst with the educt gases was carried out for a period of 100-120 minutes, as a rule up to complete deactivation of the catalyst. Thereafter, the amount of carbon deposited was determined by weighing. The structure and morphology of the carbon deposited was determined with the aid of SEM and TEM analyses. The amount of carbon deposited, based on the catalyst employed, called the yield in the following, was defined on the basis of the weight of catalyst after calcining ($m_{cat,0}$) and the increase in weight after the reaction ($m_{total} - m_{cat,0}$): Yield=$(m_{total} - m_{cat,0})/m_{cat,0}$. Examples which illustrate the invention are given in the following. It can be seen that catalysts based on Mn—Co—Mo compounds deliver a high yield.

FIGURES:

FIG. 1 SEM photograph of catalyst 6, MCN0072

FIG. 2 SEM photograph of catalyst 6, MCN0072

Figure 3:
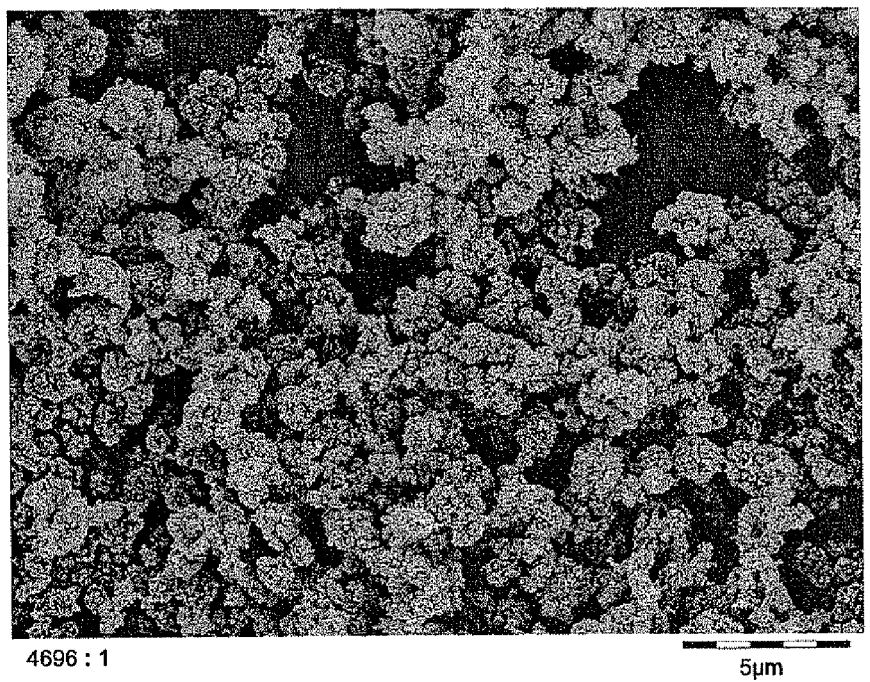

FIG. 3 SEM photograph of catalyst 6, MCN0072 after calcining for 2 h at 650° C.

Figure 4:
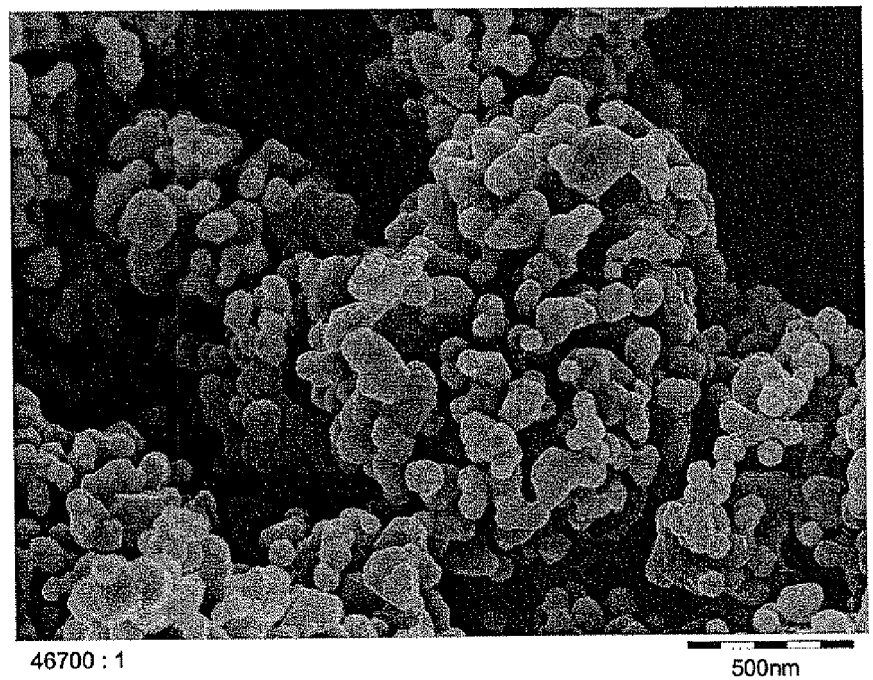

FIG. 4 SEM photograph of catalyst 6, MCN0072 after calcining for 2 h at 650° C.

stirred for 5 min. The non-cloudy mixture obtained was combined with a solution of 50.0 g $Al(O_3)_3 \cdot 9H_2O$ in 35 ml water and stirred. Clouding was dissolved by dropwise addition of dilute $HNO_3$. The solution obtained in this way is subsequently called solution A. A solution called solution B in the following was prepared by stirring 70.0 g $(NH_4)_2CO_3$ into 225 ml deionized water. The two solutions A and B were added dropwise at room temperature, with intensive stirring, into a multi-necked round-bottomed flask with a reservoir of 200 ml deionized water, the pH being kept at pH=6. After the metering (approx. 20 minutes), the mixture was subsequently stirred for a further 5 min and the solid obtained was filtered off. The solid was twice suspended in water and dispersed by stirring for 5 min and filtered off. The filter cake was dried over night at 180° C. in air and subsequently calcined at 400° C. in air for 4 h. After the calcining, 12.3 g of a black solid were obtained. The theoretical ratio of the active metals employed, based on the support material, is Co:Mo:$Al_2O_3$=52:9:39.

Catalyst 10 (MCN0064_40Fe_20Co40Al): Two solutions were prepared from 40 g $Fe(NO_3)_3 \cdot 9H_2O$ in 40 ml deionized water and 13 g $Co(NO_3)_2 \cdot 6H_2O$ in 40 ml deionized water. The solutions were combined at room temperature and stirred for 5 min. The non-cloudy mixture obtained was combined with a solution of 50.0 g $Al(NO_3)_3 \cdot 9H_2O$ in 35 ml water and stirred. Clouding was dissolved by dropwise addition of dilute $HNO_3$. The solution obtained in this way is subsequently called solution A. A solution called solution B in the following was prepared by stirring 70.0 g $(NH_4)_2CO_3$ into 225 ml deionized water. The two solutions A and B were added dropwise at room temperature, with intensive stirring, into a three-necked flask with a reservoir of 200 ml deionized water, the pH being kept at pH=6. After the metering (approx. 20

TABLE 1

Overview of experiments for testing catalysts in a fixed bed apparatus

| | Experiment | Composition | Heating in | Heating time, min | Reaction temperature, ° C. | Reaction gas | Reaction time, min | Yield $g_{CNT}/g_{cat,0}$ | Formation of MWNT |
|---|---|---|---|---|---|---|---|---|---|
| Catalyst 1 | MCN0062-20040727 | Mn:Co:Mo:$Al_2O_3$ = 23:27:11:39 | $H_2$:$N_2$ = 1:1 | 72 | 650 | $C_2H_4$:Ar:$H_2$ = 0.9:0.1:1.4 | 116 | 46.4 | yes |
| Catalyst 1 | MCN0062-2-20040804-680C-40_60 | Mn:Co:Mo:$Al_2O_3$ = 23:27:11:39 | $H_2$:$N_2$ = 1:1 | 88 | 680 | $C_2H_4$:Ar:$H_2$ = 0.9:0.1:0.8 | 120 | 38.2 | yes |
| Catalyst 2 | MCN0071-20040813 | Mn:Co:Mo:$Al_2O_3$ = 20:21:30:39 | $H_2$:$N_2$ = 1:0.67 | 73 | 650 | $C_2H_4$:Ar:$H_2$ = 0.9:0.1:1.3 | 71 | 54.6 | yes |
| Catalyst 3 | MCN0068-20040810 | Mn:Co:Mo:$Al_2O_3$ = 5:45:11:39 | $H_2$:$N_2$ = 1:1 | 71 | 650 | $C_2H_4$:Ar:$H_2$ = 0.9:0.1:1.35 | 73 | 5.0 | yes |
| Catalyst 4 | MCN0070-20040813 | Mn:Co:Mo:$Al_2O_3$ = 35:15:11:39 | $H_2$:$N_2$ = 1:1 | 73 | 650 | $C_2H_4$:Ar:$H_2$ = 0.9:0.1:1.35 | 79 | 35.2 | yes |
| Catalyst 5 | MCN0074-20040823 | Mn:Co:$Al_2O_3$ = 29:32:39 | $H_2$:$N_2$-1:1 | 73 | 650 | $C_2H_4$:Ar:$H_2$ = 0.9:0.1:1.35 | 94 | 53.9 | yes |
| Catalyst 6 | MCN0072-R2 20040824 | Mn:Co:Mo:MgO = 23:27:11:39 | $H_2$:$N_2$ = 1:1 | 73 | 650 | $C_2H_4$:Ar:$H_2$ = 0.9:0.1:1.35 | 121 | 182.2 | yes |
| Catalyst 7 | MCN0076-20040831 | Mn:Co:MgO = 28:33:39 | $H_2$:$N_2$ = 1:1 | 73 | 650 | $C_2H_4$:Ar:$H_2$ = 0.9:0.1:1.35 | 108 | 350.3 | yes |
| Catalyst 8 | MCN0079-20040902 | Mn:Co:MgO = 28:33:39 | $H_2$:$N_2$ = 1:1 | 73 | 650 | $C_2H_4$:Ar:$H_2$ = 0.9:0.1:1.35 | 120 | 96.1 | yes |

Example 3

Comparison Examples of Preparation of the Catalyst

Catalyst 9 (MCN0063_52CO_9Mo_39Al): Two solutions were prepared from 2.5 g $(NH_4)_6Mo_7O_{24} \cdot 4H_2O$ in 50 ml deionized water and 36 g $Co(NO_3)_2 \cdot 6H_2O$ in 50 ml deionized water. The solutions were combined at room temperature and minutes), the mixture was subsequently stirred for a further 5 min and the solid obtained was filtered off. The solid was twice suspended in water and dispersed by stirring for 5 min and filtered off. The filter cake was dried over night at 180° C. in air and subsequently calcined at 400° C. in air for 4 h. After the calcining, 16.8 g of a black solid were obtained. The theoretical ratio of the active metals employed, based on the support material, is Fe:Co:$Al_2O_3$=40:20:40.

Catalyst 11 (MCN0038_13Fe_4Mo_Pural MG70): 100 g Pural MG70 from Sasol were suspended in 1,500 ml deionized water and the suspension was stirred at 75° C. for 2 h and allowed to cool. The pH was adjusted to pH=9.4 by means of $(NH_4)CO_3$ solution. Two solutions were prepared from 7.3 g $(NH_4)_6Mo_7O_{24}.4H_2O$ in 40 ml deionized water and 94 g $Fe(O_3)_3.9H_2O$ in 135 ml deionized water. The solutions were combined at room temperature and stirred for 5 min, and then slowly added dropwise to the Pural suspension, during which the pH did not fall below pH=8.95. Metering was carried out over a period of 2 h and the mixture was subsequently stirred for a further 1 h. The suspension obtained in this way is subsequently called suspension A. A solution called solution B in the following was prepared by stirring 400.0 g $(NH_4)_2CO_3$ into 1,200 ml deionized water. Solution B was added to suspension A at room temperature, with intensive stirring. After the metering, the mixture was subsequently stirred for a further 5 min and the solid obtained was filtered off. The solid was washed twice with 2.5 l 1 N ammonium acetate solution each time. The filter cake was dried over night at 160° C. in air and subsequently calcined at 400° C. in air for 4 h. After the calcining, 107.9 g of a reddish solid were obtained. The theoretical ratio, based on the metallic elements employed, is Fe:Mo=13:4.

Catalyst 12 MCN0022_40Fe_60Al): A solution was prepared from 34.4 g $Fe(NO_3)_3.9H_2O$ and 99.3 g $Al(NO_3)_3.H_2O$ in 350 ml deionized water. The solution was stirred at room temperature for 5 mm. Clouding was dissolved by dropwise addition of dilute $HNO_3$. The solution obtained in this way is subsequently called solution A. A solution called solution B in the following was prepared by stirring 63.6 g $Na_2CO_3$ into 600 ml deionized water. The two solutions A and B were added dropwise at room temperature, with intensive stirring, into a multi-necked round-bottomed flask with a reservoir of 200 ml deionized water, the pH being kept at pH=7.6. After the metering (approx. 60 minutes), the mixture was subsequently stirred for a further 60 mm and the solid obtained was filtered off. The solid was washed twice with water at 80° C. The filter cake was dried over night at 80° C. in air and subsequently calcined at 450° C. in air for 5 h. After the calcining, 20 g of a black solid were obtained. The theoretical ratio of the active metals employed, based on the support material, is $Fe:Co:Al_2O_3$=40:20:40.

Catalyst 13 (MCN0037_50Fe_11Mo_39Al): Two solutions were prepared from 12.5 g $(NH_4)_6Mo_7O_{24}.4H_2O$ in 250 ml deionized water and 245 g $Fe(NO_3)_3.9H_2O$ in 250 ml deionized water. The solutions were combined at room temperature and stirred for 5 min at room temperature. The non-cloudy mixture obtained was combined with a solution of 245 g $Al(NO_3)_3.9H_2O$ in 163 ml water and stirred. Clouding was dissolved by dropwise addition of dilute $HNO_3$. The solution obtained in this way is further called solution A. A solution called solution B in the following was prepared by stirring 350.0 g $(NH_4)_2CO_3$ into 1,050 ml deionized water. The two solutions A and B were added dropwise at room temperature, with intensive stirring, into a multi-necked round-bottomed flask with a reservoir of 1,000 ml deionized water, the pH being kept at pH=6. After the metering (approx. 90 minutes), the mixture was subsequently stirred for a further 5 min and the solid obtained was filtered off. The solid was twice suspended in water and dispersed by stirring for 5 min and filtered off. The filter cake was dried over night at 180° C. in air and subsequently calcined at 400° C. in air for 4 h. After the calcining, 99.3 g of a black solid were obtained. The theoretical ratio of the active metals employed, based on the support material, is $Fe:Mo:Al_2O_3$=50:11:39.

Catalyst 14 (MCN0044_8Fe_1Mo_1Co on Pural MG30): Two solutions were prepared from 0.1 g $(NH_4)_6Mo_7O_{24}.4H_2O$ in 5.5 ml deionized water and 4 g $Fe(NO_3)_3.9H_2O$ and 0.275 g $Co(NO_3)_2.6H_2O$ in 10 ml deionized water. The solutions were combined at room temperature and stirred for 5 min at room temperature. One third of the non-cloudy solution obtained was applied by means of incipient wetness impregnation to 20 g Pural MG30, which was dried beforehand for 4 h at 180° C. After drying for 2 h at 120° C. and subsequent calcining in air for 3 h at 450° C., the remainder of the solution containing metal ions was applied in two further analogous impregnation, drying and calcining steps. The theoretical ratio of the active metals employed, based on the support material, is $Fe:Mo:Co:Al_2O_3$=8:1:1:90.

Example 4

Comparison Example of Testing Catalysts in a Fixed Bed

The catalysts obtained under Example 3 were likewise tested in the laboratory apparatus as described under Example 2. The yields of carbon nanotubes achieved are summarized in Table 2. The yields of the catalysts prepared there under comparable conditions or by precipitation are significantly lower than the yields described in Example 2.

TABLE 2

Summary of the results of experiments in Example 4 (comparison example)

| | Experiment | Composition | Heating in | Heating time, min | Reaction temperature, ° C. | Reaction gas | Reaction time, min | Yield $g_{CNT}/g_{cat,0}$ | Formation of MWNT |
|---|---|---|---|---|---|---|---|---|---|
| Catalyst 9 | MCN0063-20040802 | Co:Mo:Al = 52:9;39 | $H_2:N_2$ = 1:1 | 67 | 650 | $C_2H_4$:Ar:$H_2$ = 0.9:0.1:1.4 | 112 | 3.8 | yes |
| Catalyst 10 | MCN0064-20040810 | Fe:Co:Al = 40:20:40 | $H_2:N_2$ = 1:1 | 75 | 650 | $C_2H_4$:Ar:$H_2$ = 0.9:0.1:0.86 | 123 | 16.9 | yes |
| Catalyst 11 | MCN0038-20040528 | Fe:Co = 13:4 on Pural MG70 | $H_2:N_2$ = 1:1 | 90 | 650 | $C_2H_4$:Ar:$H_2$ = 0.9:0.1:1.2 | 59 | 9.181 | yes |
| Catalyst 12 | MCN0022-20040823 | Fe:$Al_2O_3$ = 40:60 | $H_2:N_2$ = 1:1 | 73 | 650 | $C_2H_4$:Ar:$H_2$ = 0.9:0.1:1.2 | 70 | 10.3 | yes |
| Catalyst 13 | MCN0037-20040528 | Fe:Mo:$Al_2O_3$ = 50:11:19 | $H_2:N_2$ = 1:1 | 71 | 650 | $C_2H_4$:Ar:$H_2$ = 0.9:0.1:1.2 | 71 | 23.2 | yes |
| Catalyst 14 | MCN0044-20040629 | Fe:Mo:Co:$Al_2O_3$ = 8:1:1:90 | $H_2:N_2$-1:1 | 113 | 650 | $C_2H_4$:Ar:$H_2$ = 0.9:0.1:1.2 | 63 | 5.4 | yes |

The invention claimed is:

1. A process for producing carbon nanotubes comprising:
   a) preparing a catalyst by joint precipitation:
   b) thermally pretreating the catalyst in an oxidizing atmosphere at a temperature between 300° C. and 900° C.; and
   c) decomposing a gaseous hydrocarbon on the catalyst to form carbon nanotubes;
   wherein the catalyst consists essentially of
      (1) catalytically active metal compounds based on Mn and Co and optionally one or more compounds based on Mo, Cu, W, V, Cr, or Sn; and
      (2) an inert material selected from the group consisting of one or more compounds of Ca, Mg, Al, Ce, Ti, and La;
   wherein said Mn is present in said catalyst in an amount in the range from 25-75 mol % and Co is present in said catalyst in an amount in the range of from 25-75 mol %, based on the total content of Mn and Co and optionally Mo, Cu, W, V, Cr, or Sn.

2. The process of claim 1, wherein said catalyst further consists essentially of one or more compounds based on Mo.

3. The process of claim 1, wherein said Mn is present in said catalyst in an amount in the range of from 10 to 90 mol %, based on the total content of Mn and Co and optionally Mo, Cu, W, V, Cr, or Sn, and said Co is present in said catalyst in an amount in the range of from 10 to 90 mol %, based on the total content of Mn and Co and optionally Mo, Cu, W, V, Cr, or Sn.

4. The process of claim 1, wherein said catalyst further consists essentially of one or more compounds based on Cu, W, V, Cr, or Sn.

5. The process of claim 1, wherein said catalyst further consists essentially of one or more compounds based on Cu, W, V, Cr, or Sn in an amount in the range of from 0.2 to 50 mol %.

6. The process as claimed in claim 1, wherein the carbon nanotubes have a main diameter of from 3 nm to 150 nm and the process is conducted by decomposition of a gaseous hydrocarbon on said catalyst and said catalyst is a heterogenous catalyst.

7. The process according to claim 1, wherein said hydrocarbon is in the form of an educt gas.

8. The process according to claim 7, wherein said educt gas is a light hydrocarbon.

9. The process according to claim 8, wherein said light hydrocarbon is an aliphatic, olefin, or mixture thereof.

10. The process according to claim 1, wherein said process is performed in a reaction chamber and further comprises continuously feeding said catalyst and removing carbon nanotubes formed together with spent catalyst.

11. The process according to claim 1, wherein said process is performed in a reaction chamber and further comprises discontinuously feeding said catalyst and removing carbon nanotubes formed together with spent catalyst.

12. The process according to claim 1, wherein said process is performed in a reaction chamber and further comprises introducing said catalyst into said reaction chamber in a form wherein the-catalytically active metal compounds of said catalyst are in the form of partly or completely reduced oxides or as hydroxides.

13. The process according to claim 1, wherein the inert material comprises Mg.

* * * * *